United States Patent
Takeshita et al.

[11] Patent Number: 6,040,529
[45] Date of Patent: Mar. 21, 2000

[54] FLEXIBLE SUBSTRATE

[75] Inventors: Naoki Takeshita; Manabu Kusano; Fumihiko Sagawa, all of Fukushima-ken; Taizo Nakagawa, Fukuhisma-ken, all of Japan

[73] Assignee: Alps Electric Co., Ltd., Tokyo, Japan

[21] Appl. No.: 09/025,598

[22] Filed: Feb. 18, 1998

[30] Foreign Application Priority Data

Feb. 19, 1997 [JP] Japan ................................. 9-0521039

[51] Int. Cl.[7] .................................................. H05K 1/00
[52] U.S. Cl. .................. 174/254; 361/777; 361/803; 439/67
[58] Field of Search ............... 174/254; 439/67, 439/876; 361/749, 773, 774, 784, 803, 777

[56] References Cited

U.S. PATENT DOCUMENTS

| | | | |
|---|---|---|---|
| 4,933,810 | 6/1990 | Cardashian et al. | 361/749 |
| 5,471,163 | 11/1995 | Childers | 327/525 |
| 5,493,074 | 2/1996 | Murata et al. | 174/254 |
| 5,831,836 | 11/1998 | Long et al. | 361/820 |

*Primary Examiner*—Kristine Kincaid
*Assistant Examiner*—Dhiru R Patel
*Attorney, Agent, or Firm*—Brinks Hofer Gilson & Lione

[57] ABSTRACT

Disclosed is a flexible substrate whose conductor patterns can be firmly connected to conductor patterns of a printed circuit board.

Conductor patterns for connection (4) are formed on one side of a flexible substrate so as to be opposed to conductor patterns (2) provided on a printed circuit board (1), wherein recesses (4b) or/and protrusions (4c) are provided on either side end of each conductor pattern for connection (4).

4 Claims, 4 Drawing Sheets

FLEXIBLE SUBSTRATE

BACKGROUND OF THE INVENTION

1. Field of the Invention

The present invention relates to a flexible substrate one end of which is connected, for example, to a conductor pattern on a printed circuit board and the other end of which is connected to a connector mounted to this printed circuit board or to a conductor pattern of another printed circuit board. In the present invention, an improvement is achieved in terms of the strength with which the flexible substrate is connected to the printed circuit board by soldering.

2. Description of the Related Art

With reference to FIGS. 9 through 11, a conventional manner in which a printed circuit board and a flexible substrate are connected together will be described. FIG. 9 is a plan view; FIG. 10 is a sectional view taken along the line X—X of FIG. 9; and FIG. 10 is a detailed view of the portion B of FIG. 10.

On a printed circuit board 41, a plurality of conductor patterns 42 are arranged side by side and extend from a circuit formed at a position (not shown) on the printed circuit board 41 to the vicinity of an end portion 41a. On a flexible substrate 43 to be connected to this printed circuit board 41, a plurality of conductor patterns 44 are arranged side by side and extend to the vicinity of an end portion 44a.

Each of these conductor patterns 42 and 44 has a fixed width, with its side ends being linear. The pitch of the conductor patterns 44 of the flexible substrate 43 is the same as the pitch of the conductor patterns 42 of the printed circuit board 41. Further, the width Wb of the conductor patterns 44 of the flexible substrate 43 is smaller than the width Wa of the conductor patterns 42 of the printed circuit board 41.

Cream solder is applied to the conductor patterns 42 of the printed circuit board 41. As shown in FIG. 10, the plurality of conductor patterns 44 of the flexible substrate 43 are opposed to the plurality of conductor patterns 42 of the printed circuit board 41 such that each conductor pattern 44 is situated at a position substantially corresponding to the center of the associated conductor pattern 42. The printed circuit board 41 and the flexible substrate 43 are stacked together and connected to each other by an appropriate method using a reflow furnace or the like.

Solder does not easily adhere to the opposed contact surfaces of the conductor patterns 42 of the printed circuit board 41 and the conductor patterns 44 of the flexible substrate 43. Generally speaking, as shown in FIG. 11, the adhesion of the solder is effected such that the solder extends from the side ends 44a of the conductor patterns 44 of the flexible substrate 43, which have a relatively small width, over the upper surfaces of the conductor patterns 42 of the printed circuit board 41 which are outside these side ends 44a.

In the above construction, however, the side ends 44a of the conductor patterns 44 of the flexible substrate 43 are linear, and the thickness of the conductor patterns 44 of the flexible substrate 43 is small, so that the solder fillets 45 connecting the conductor patterns 42 of the printed circuit board 41 with the side ends 44a of the conductor patterns 44 are small, as shown in FIG. 11. Further, the connecting distance X over which the solder fillets 45, extending from the side ends 44a of the conductor patterns 44 of the flexible substrate 43, are connected with the conductor patterns 42 of the printed circuit board 41 is rather small.

As a result, the strength with which the conductor patterns 42 of the printed circuit board 41 are connected to the conductor patterns 44 of the flexible substrate 43 is rather low, so that the printed circuit board 41 and the flexible substrate 43 are liable to be separated from each other.

SUMMARY OF THE INVENTION

It is an object of the present invention to enable the conductor patterns 44 of the flexible substrate 43 to be firmly connected to the conductor patterns 42 of the printed circuit board 41.

To achieve the above object, in the flexible substrate of the present invention, conductor patterns for connection are formed on one side thereof opposite to the conductor patterns provided on the associated printed circuit board, and recesses or/and protrusions are provided on the side ends of the conductor patterns for connection.

Further, in the flexible substrate of the present invention, the above-mentioned recesses or protrusions are formed in a staggered arrangement on either side end of each conductor pattern for connection.

Further, in the flexible substrate of the present invention, conductor patterns for connection are formed on one side thereof opposite to the conductor patterns provided on the associated printed circuit board, and, at the same time, an island-like conductor pattern is formed on the other side thereof in correspondence with the above-mentioned conductor patterns for connection, wherein the conductor patterns for connection and the island-like conductor pattern are connected together by an electrode provided on an end surface, and wherein the conductor patterns for connection are soldered to the conductor patterns of the printed circuit board, the above-mentioned electrode being connected to the conductor patterns of the printed circuit board.

Further, in the flexible substrate of the present invention, a recess is formed in the above-mentioned end surface, and the above-mentioned electrode is provided in the recess.

DETAILED DESCRIPTION OF THE PREFERRED EMBODIMENT

Figure 1:
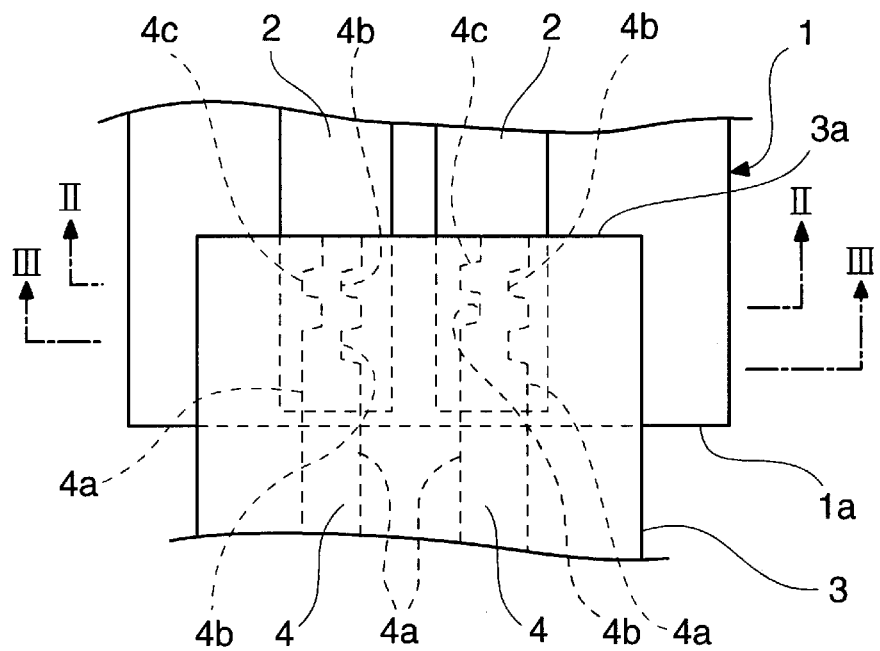
FIG. 1 is a plan view showing how a flexible substrate in accordance with the present invention is connected.
Figure 2:
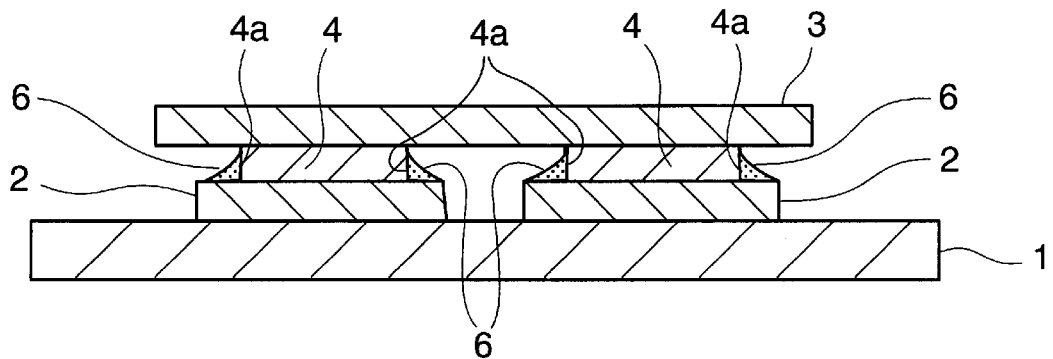
FIG. 2 is a sectional view taken along the line II—II of FIG. 1.
Figure 3:
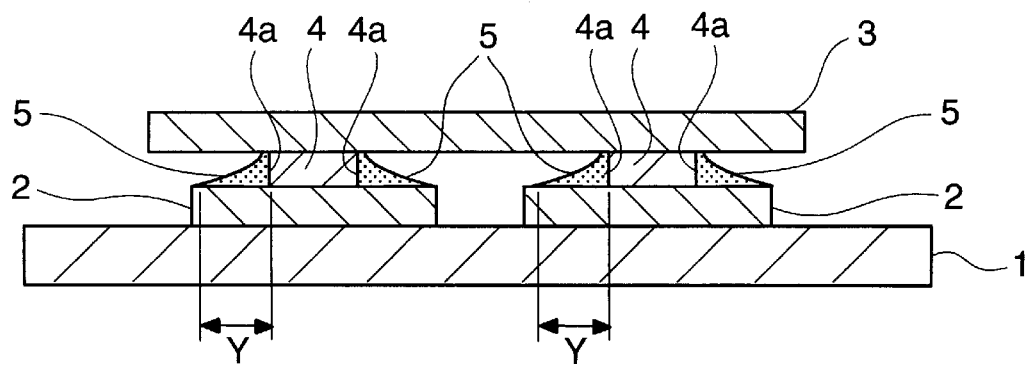
FIG. 3 is a sectional view taken along the line III—III of FIG. 1.
Figure 4:
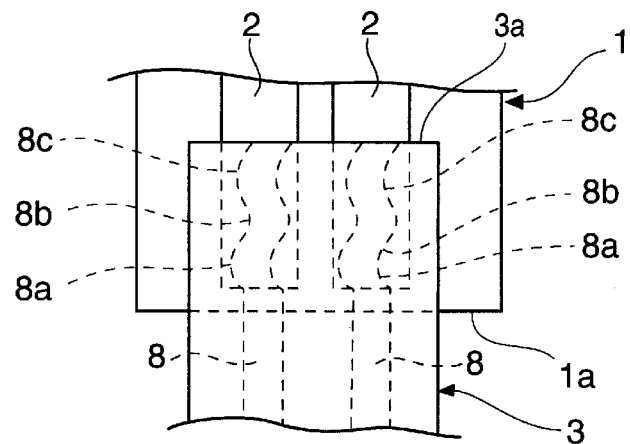
FIG. 4 is a plan view showing a first modification of the flexible substrate of the present invention.
Figure 5:
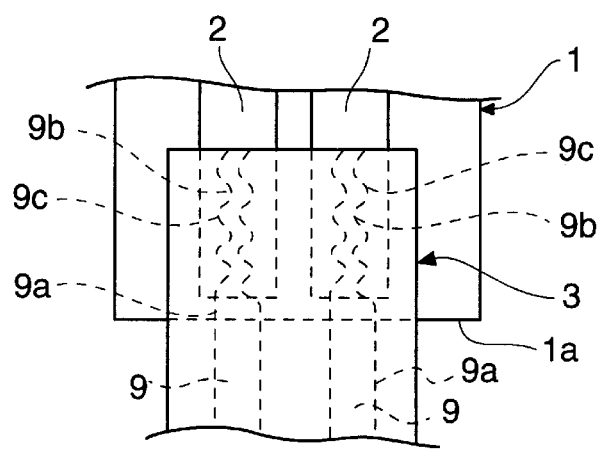
FIG. 5 is a plan view showing a second modification of the flexible substrate of the present invention.
Figure 6:
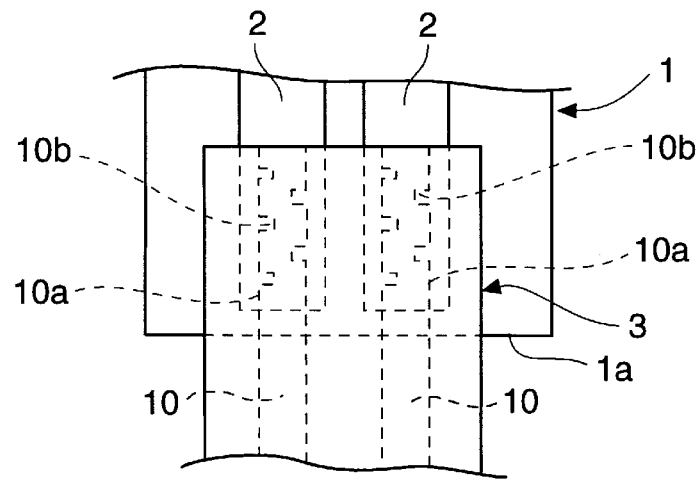
FIG. 6 is a plan view showing a third modification of the flexible substrate of the present invention.
Figure 7:
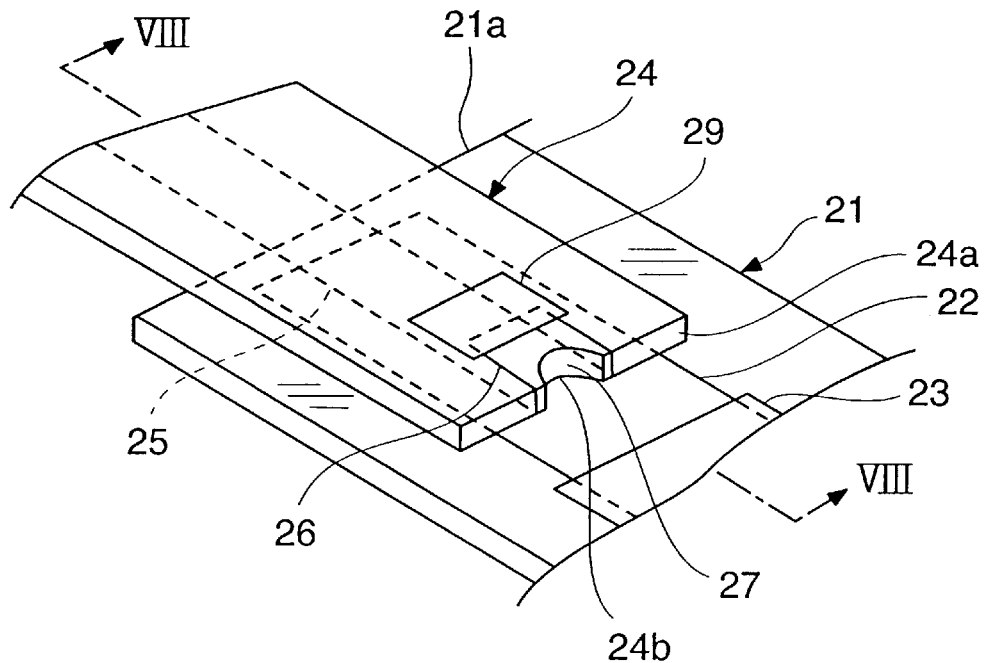
FIG. 7 is a perspective view showing a fourth modification of the flexible substrate of the present invention.
Figure 8:
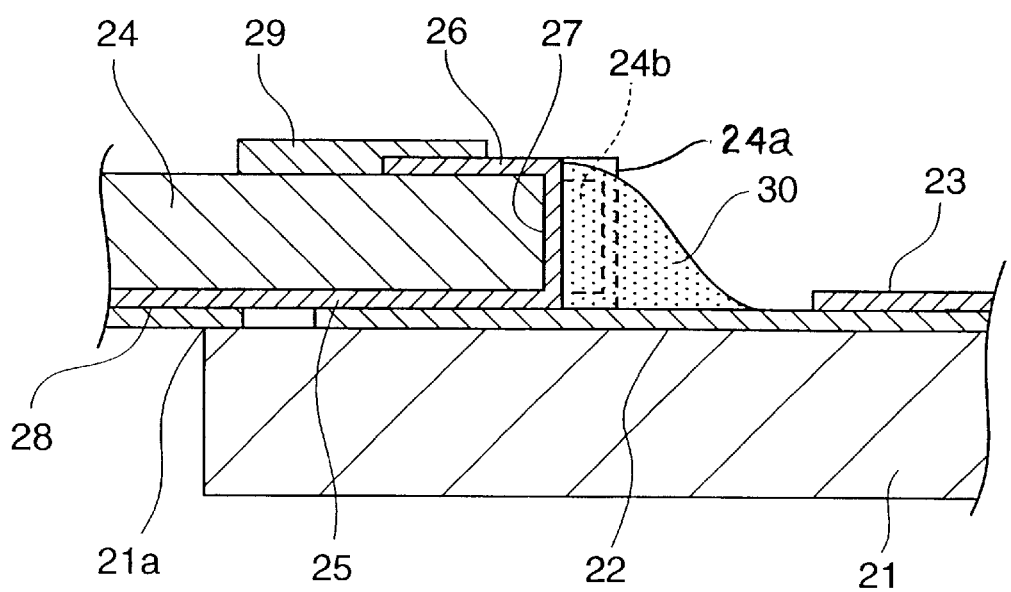
FIG. 8 is a sectional view taken along the line VII—VII of FIG. 7.

The flexible substrate of the present invention will now be described with reference to FIGS. 1 through 8. FIGS. 1 through 6 show embodiments of the flexible substrate of the present invention. FIG. 1 is a plan view; FIG. 2 is a sectional view taken along the line II—II of FIG. 1; FIG. 3 is a sectional view taken along the line III—III of FIG. 1; FIG. 4 is a plan view showing a first modification of the flexible substrate of the present invention; FIG. 5 is a plan view showing a second modification of the flexible substrate of the present invention; FIG. 6 is a plan view showing a third modification of the flexible substrate of the present invention; FIG. 7 is a perspective view showing a fourth modification of the flexible substrate of the present invention; and FIG. 8 is a sectional view taken along the line VII—VII of FIG. 7.

First, referring to FIGS. 1 through 3, on a printed circuit board 1, a plurality of conductor patterns 2 are arranged side by side and extend from a circuit formed at a position (not shown) on the printed circuit board to the vicinity of an end portion 1a. Also, on a flexible substrate 3 connected to this printed circuit board 1, a plurality of conductor patterns 4 for connection to conductor patterns 2 are arranged side by side and extend to the vicinity of an end portion 3a. On either end 4a of each conductor pattern 4, there are provided recesses 4b and protrusions 4c, which are formed in a staggered arrangement. The width Wd of the conductor patterns 4 of the flexible substrate 3 is smaller than the width Wc of the conductor patterns 2 of the printed circuit board 1. Further, the pitch of the conductor patterns 4 of the flexible substrate 3 is equal to the pitch of the conductor patterns 2 of the printed circuit board 1.

Cream solder is applied to the conductor patterns 2 of the printed circuit board 1, and, as shown in FIGS. 2 and 3, the plurality of conductor patterns 4 of the flexible substrate 3 are opposed to the plurality of conductor patterns 2 of the printed circuit board 1 such that each conductor pattern 4 is situated substantially at the center with respect to the width dimension of the associated conductor pattern 2. The printed circuit board 1 and the flexible substrate 3 are stacked together in this fashion and connected to each other by an appropriate method using a reflow furnace or the like.

Solder does not easily adhere to the opposing contact surfaces of the conductor patterns 2 of the printed circuit board 1 and the conductor patterns 4 of the flexible substrate 3. Generally speaking, as shown in FIGS. 2 and 3, solder fillets are formed so as to extend from the side ends 4a of the conductor patterns 4 of the flexible substrate 3, which have a relatively small width, over the upper surfaces of the conductor patterns 2 of the printed circuit board 1, which extend outside the side ends 4a.

Figure 11:
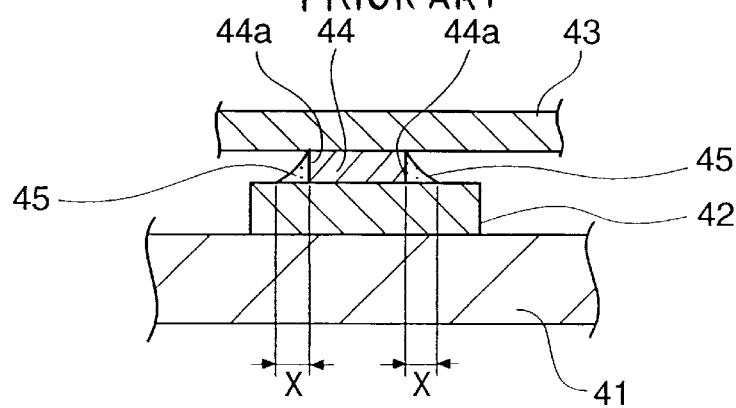
FIG. 11 is a detailed view of the portion B of FIG. 9.

As shown in FIG. 3, relatively large solder fillets 5 are formed in the recesses 4b formed in the side ends 4a of the conductor patterns 4 of the flexible substrate 3. On the other hand, as shown in FIG. 2, solder fillets 6 which are smaller than the solder fillets 5 are formed on the protrusions 4c, which are formed between the recesses 4b. The smaller solder fillets 6 have substantially the same size as the solder fillets 45 in the prior art shown in FIG. 11. That is, in the recesses 4b, solder is easily collected during soldering, with the result that the fillets 5 become relatively large.

As a result of the enlargement of the solder fillets 5, the connection area of the conductor patterns 2 of the printed circuit board 1 increases, and the connection length Y of the solder on the conductor patterns 2 of the printed circuit board 1 as measured from the side ends 4a of the conductor patterns 4 of the flexible substrate 3 also increases. As a result, the strength with which the conductor patterns 2 of the printed circuit board 1 are connected to the conductor patterns 4 of the flexible substrate 3 increases, so that the flexible substrate 3 is not easily separated from the printed circuit board 1. The connection length X of the solder on the protrusions 4c of the conductor patterns 4 of the flexible substrate 3 is substantially the same as the connection length in the prior art shown in FIG. 11.

Further, on the side ends 4a of the conductor patterns 4 of the flexible substrate 3, protrusions 4c are formed between the recesses 4b. Due to the formation of the recesses 4b and the protrusions 4c on the side ends 4a of the conductor patterns 4, there is a substantial enlargement of the length of the side ends 4a. Thus, the soldering distance of the conductor patterns 2 of the printed circuit board 1 increases. This also results in an increase in the connection area of the solder to thereby achieve an improvement in terms of soldering strength. Since the recesses 4b and the protrusions 4c are formed in a staggered arrangement on either end of each conductor pattern 4, the width of the conductor pattern 4 is substantially fixed, and there is no locally weak portion, so that it is possible to maintain the requisite strength of the conductor pattern 4.

FIG. 4 shows an embodiment in which the side ends 8a of conductor patterns 8 of the flexible substrate 3 have an S-shaped configuration to thereby form curved recesses 8b and curved protrusions 8c, the curved recesses 8b and the curved protrusions 8c being staggered. In these curved recesses 8b also, solder is easily collected during soldering, so that the fillets 5 can be made large (See FIG. 3), and the connection area of the solder fillet 5 on the conductor patterns 8 of the printed circuit board 1 can be made large. Further, due to the curved recesses 8b and the curved protrusions 8c, the side ends 8a of the conductor patterns 8 are elongated, and the soldering length of the conductor patterns 8 of the printed circuit board 1 is also enlarged, thereby achieving an increase in soldering strength.

FIG. 5 shows an embodiment in which triangular recesses 9b and triangular protrusions 9c are formed on either side end 9a of each conductor pattern 9 of the flexible substrate 3, the triangular recesses 9b and the triangular protrusions 9c being staggered. These recesses 9b and protrusions 9c have completely the same effect as the recesses 4b and the protrusions 4c shown in FIGS. 1 through 3 and the recesses 8b and the protrusions 8c shown in FIG. 4, achieving an improvement in terms of the strength with which the conductor patterns 9 of the flexible substrate 3 are soldered to the conductor patterns 2 of the printed circuit board 1.

FIG. 6 shows an embodiment in which cutouts are provided on either side end 10a of each conductor pattern 10 for connecting the flexible substrate to form slit-like recesses 10b, the slit-like recesses 10b being staggered. In these recesses 10b also, solder is easily collected, so that the solder fillets can be made large. Further, the connection area between the solder fillets and the conductor patterns 2 of the printed circuit board 1 can be enlarged.

The printed circuit board 1 in the above described embodiments may be a flexible one.

Next, a fourth modification of the flexible substrate of the present invention will be described with reference to FIGS. 7 and 8. On the upper side of a printed circuit board 21, a conductor pattern 22 is formed so as to extend to the vicinity of an end portion 21a of this printed circuit board 21, and a resist 23 is provided at a predetermined position on this conductor pattern 22. In an end surface 24a of a flexible substrate 24, which is soldered to the conductor pattern 22 of this printed circuit board 21, there is formed a curved or semi-circular recess 24b, and a conductor pattern 25 formed on one side (the lower side in FIG. 7) extends up to this recess 24b. The width of this conductor pattern 25 is smaller than the width of the conductor pattern 22 of the printed circuit board 21.

On the other side (the upper side in FIG. 7) of the flexible substrate 24, an island-like conductor pattern 26 is formed in correspondence with the conductor pattern 25 formed on the lower side. This island-like conductor pattern 26 also extends to the recess 24b of the end surface 24a of the flexible substrate 24. The conductor pattern 25 on the lower side of the flexible substrate 24 and the island-like conductor pattern 26 on the upper side thereof are connected to each other in the recess 24b provided in the end surface 24a through an electrode 27 formed, for example, by electroless plating and electrolytic plating. Thus, the island-like conductor pattern 26 on the upper side of the flexible substrate 24 is used as a dummy pattern for forming an electrode in the recess 24b.

This flexible substrate 24 is placed on the printed circuit board 21, and the conductor pattern 25 of the flexible substrate 24 is soldered to the conductor pattern 22 of the printed circuit board 21. Further, the electrode 27 on the recess 24b provided in the end surface 24a of the flexible substrate 24 is soldered to the conductor pattern 22 of the printed circuit board 21. Resists 28 and 29 are provided at predetermined positions on the conductor pattern 25 of the flexible substrate 24 and the island-like conductor pattern 26 so as to prevent unnecessary solder from adhering.

Thus, in the printed circuit board 21 and the flexible substrate 24, not only are the conductor pattern 22 of the printed circuit board 21 and the connecting conductor pattern 25 of the flexible substrate 24, which are opposed to each other, soldered together, but, as shown in FIG. 8, the electrode 27 provided on the end surface 24a of the flexible substrate 24 and the conductor pattern 22 of the printed circuit board 21 are soldered to each other, whereby an improvement is achieved in terms of connection strength. Further, since the electrode 27 of the end surface 24a of the flexible substrate 24 is formed on the recess 24b, a large amount of solder is collected in this electrode 27, with the result that a large solder fillet 30 is formed, whereby a further improvement is achieved in terms of the connection strength between the printed circuit board 21 and the flexible substrate 24.

Figure 9:
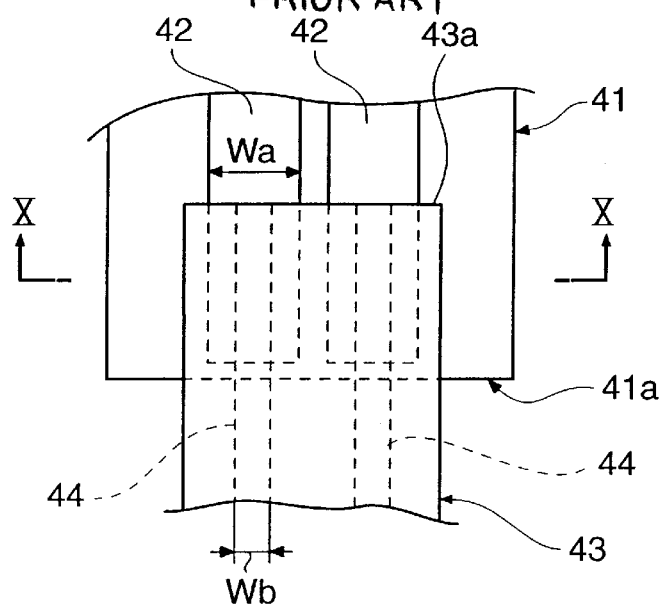
FIG. 9 is a plan view showing how a conventional flexible substrate is connected.
Figure 10:
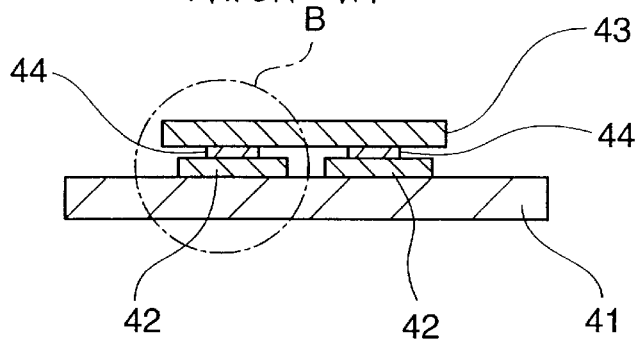
FIG. 10 is a sectional view taken along the line X—X of FIG. 9.

It is also possible to use a conventional conductor pattern 44 as shown in FIG. 9 as the conductor pattern 25 on the lower side of the flexible substrate 24. However, by using the conductor patterns 4, 8, 9 and 10 of the present invention, shown in FIGS. 1 through 6, a further improvement is achieved in terms of the connection strength between the printed circuit board 21 and the flexible substrate 24.

The printed circuit board 21 in the above description may be a flexible one.

As described above, on one side of the flexible substrate of the present invention, conductor patterns for connection are formed opposite to conductor patterns provided on the associated printed circuit board, and recesses or/and protrusions are provided on the side ends of these conductor patterns for connection, so that, when these conductor patterns are connected to conductor patterns of another printed circuit board, the length of the side ends soldered to the other printed circuit board increases, whereby an improvement is achieved in soldering strength. Further, in these recesses, the size of the solder fillets increases, and the connection area between these solder fillets and the conductor patterns of the printed circuit board increases, whereby a further improvement is achieved in terms of the strength with which the conductor patterns of the flexible substrate and the conductor patterns of the printed circuit board are connected to each other.

Further, in the flexible substrate of the present invention, the recesses or the protrusions are provided in a staggered arrangement on either side end of each conductor pattern, so that it is possible to make the width of the conductor patterns for connection substantially fixed without making it locally small, thereby preventing the conductor patterns from being weakened.

Further, in a flexible substrate according to the present invention, a conductor pattern for connection is formed on one side of the flexible substrate so as to be opposed to a conductor pattern provided on the associated printed circuit board, and an island-like conductor pattern is formed on the other side of the flexible substrate in correspondence with the conductor pattern for connection, wherein the conductor pattern for connection and the island-like conductor pattern are connected to each other through an electrode provided on an end surface, and wherein the electrode is connected to the conductor pattern of the printed circuit board, so that the flexible substrate is soldered to the conductor pattern of the printed circuit board also at the end surface, whereby an improvement is achieved in terms of solder connection strength. By effecting solder connection at the end surface of the flexible substrate, separation at the end surface can be prevented.

Further, in a flexible substrate according to the present invention, a recess is formed in an end surface, and an electrode is provided in this recess, so that solder is easily collected in this recess, whereby a further improvement is achieved in terms of the strength with which the flexible substrate is connected by soldering to a conductor pattern of another printed circuit board.

What is claimed is:

1. A flexible substrate on one side of which a conductor pattern for connection is formed so as to be opposed to a conductor pattern provided on a printed circuit board, wherein recesses or/and protrusions are provided on either side end of said flexible substrate conductor pattern for connection.

2. A flexible substrate according to claim 1, wherein said recesses or/and protrusions are provided on either side end of said flexible substrate conductor pattern for connection in a staggered arrangement.

3. A flexible substrate wherein a conductor pattern for connection is formed on one side thereof so as to be opposed to a conductor pattern provided on a printed circuit board, wherein an island-like conductor pattern is formed on the other side of said flexible substrate in correspondence with said flexible substrate conductor pattern for connection, wherein said flexible substrate conductor pattern and said island-like conductor pattern are connected to each other through an electrode provided on an end surface of said flexible substrate, and wherein said electrode is being connected to the conductor pattern of said printed circuit board.

4. A flexible substrate according to claim 3, wherein a recess is formed in said end surface, of said flexible substrate said electrode being provided in said recess.

* * * * *